United States Patent [19]
Kim

[11] Patent Number: 5,466,637
[45] Date of Patent: Nov. 14, 1995

[54] METHOD OF MAKING A SELF-ALIGNED CONTACT IN SEMICONDUCTOR DEVICE

[75] Inventor: Jae K. Kim, Kyoungki, Rep. of Korea

[73] Assignee: Hyundai Electronics Industries Co., Ltd., Kyoungki, Rep. of Korea

[21] Appl. No.: 118,458

[22] Filed: Sep. 8, 1993

[30] Foreign Application Priority Data

Sep. 9, 1992 [KR] Rep. of Korea .................. 92-16544

[51] Int. Cl.$^6$ .................................. H01L 21/283
[52] U.S. Cl. .................. 437/187; 437/195; 437/239; 437/984
[58] Field of Search ................... 437/187, 195, 437/44, 239, 228, 52, 984, 149, 150, 151

[56] References Cited

U.S. PATENT DOCUMENTS

| | | | |
|---|---|---|---|
| 4,951,100 | 8/1990 | Parrillo | 437/44 |
| 4,956,312 | 11/1990 | Van Laarhoven | 437/180 |
| 5,153,145 | 10/1992 | Lee et al. | 437/44 |
| 5,234,850 | 8/1993 | Liao | 437/44 |
| 5,275,972 | 1/1994 | Ogawa et al. | 437/195 |

FOREIGN PATENT DOCUMENTS

| | | | |
|---|---|---|---|
| 61-22630 | 1/1986 | Japan | 437/239 |
| 2-81470 | 3/1990 | Japan | 437/984 |

*Primary Examiner*—T. N. Quach
*Attorney, Agent, or Firm*—Morgan & Finnegan

[57] ABSTRACT

A method of making a self-aligned contact in a semiconductor device has some advantages in that the increasing tolerance of contact mask for following the contact hole may lead to reduction of the contact area by the following means: at the side wall of contact hole which connects the first conductive line and the third line up and down, a silicon spacer which insulates from the second conductive line is formed; then, the said spacer in part or whole is thermally oxidized and the upper part of silicon spacer is insulated, thus forming the contact hole thereof.

6 Claims, 2 Drawing Sheets

METHOD OF MAKING A SELF-ALIGNED CONTACT IN SEMICONDUCTOR DEVICE

BACKGROUND OF THE INVENTION

1. Technical Field of the Invention

The present invention relates to an improved method of making a self-aligned conductor in semiconductor device, that reduces the contact area. More particularly, this invention relates to a method of making a self-aligned contact in a semiconductor device, including filling a contact hole with thermal oxide spacer.

2. Description of the Prior Art

Generally, in a semiconductor device equipped with multi-layer conductive lines, the contact which connects the conductive lines vertically should be insulated from other layers. In a prior art, a method of making a contact of a semiconductor device having 3-layer conductive line was as follows:

On a semiconductor substrate, there was formed a series of the first conductive line, the first dielectric layer, a series of the second conductive line, and the second dielectric layer successively. By removing an appropriate part of the second dielectric layer and second conductive line, the contact hole exposing the first conductive line is formed. Also, the third conductive line, which fills up the contact hole, is connected to the first conductive line. Between the third conductive line, filling up the contact hole and the second conductive line, the second dielectric layer is inserted to maintain a certain distance.

To maintain regular intervals between the third conductive line and second conductive line nearby the contact hole, the etching mask of the third conductive line and the etching mask of contact hall should be in accordance with the standard design rule, and the following factors should be considered;

1) Misalignment tolerance in forming pattern, lens distortion, and critical dimension variation.

2) Registration between mask and mask.

3) Thickness of dielectric layer within the contact hole.

The aforementioned contact of the prior art in manufacturing contact has the problems of enlarging the contact area owing to the above-said factors.

SUMMARY OF THE INVENTION

A principal object of the present invention, therefore, is to provide a method of making a self-aligned contact in a semiconductor device, reducing the contact area by a silicon spacer formed at the side wall of contact hole while insulating from the other conductive line. The spacer is thermally oxidized to form a thermal oxide layer and the etching mask designed to form the contact hole is provided, being larger than the dimension of contact hole.

In accordance with the present invention, a method for making a self-aligned contact in semiconductor device comprises: forming a contact hole by removing the second dielectric layer, the second conductive line and the first dielectric layer successively, in order that a predetermined part of the first conductive line on the semiconductor substrate is exposed, forming a thermal oxide at the side wall of the second conductive line within the contact hole and on the upper part of the first conductive line, forming a nitride on said thermal oxide and the second dielectric layer, forming a silicon spacer on the second conductive line and nitride at the side wall of the second dielectric layer, forming a thermal oxide layer by making an appropriate thickness of silicon spacer thermally oxidized, exposing the first conductive line by removing an appropriate thickness covering the nitride layer, oxide layer, and thermal oxide layer exposed inside of the contact hole as well as the nitride layer and the second dielectric layer outside of the contact hole, while reserving an appropriate thickness covering the thermal oxide and the second dielectric layer formed on the surface of the silicon spacer, forming a third conductive line contacting with the exposed first conductive line.

DESCRIPTION OF THE PREFERRED EMBODIMENTS

The first embodiment of this invention, describing a method whereby a metal wiring, the third conductive line, is connected to the source/drain electrode, the first conductive line, while insulating the gate electrode, the second conductive line.

Figure 1A:
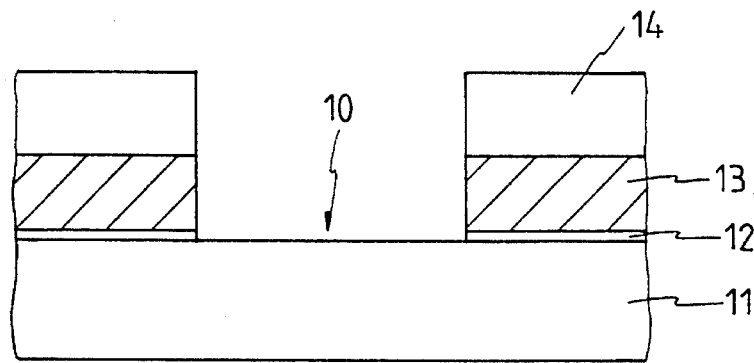
FIG. 1A–1D are cross-sectional views illustrating the processes for making self-aligned contact of the semiconductor device in the first embodiment of the present invention.

Referring to FIG. 1A, the field oxide (unillustrated) is formed at the proposed area of element separation on the silicon semiconductor substrate 11; formed in due sequence are gate oxide 12, the first dielectric layer, polysilicon layer (unillustrated) to be gate electrode 13, second conductive line, and interlayer oxide 14, the second dielectric layer; then, for exposure of the proposed area as the first conductive line of the semiconductor substrate (11) interlayer oxide, polysilicon layer and gate oxide cover are removed in order, and a contact hole (10) is formed. Hence, the etched polysilicon pattern becomes gate electrode 13 and interlayer oxide 14 is preserved on the upper part of gate electrode 13.

Figure 1B:
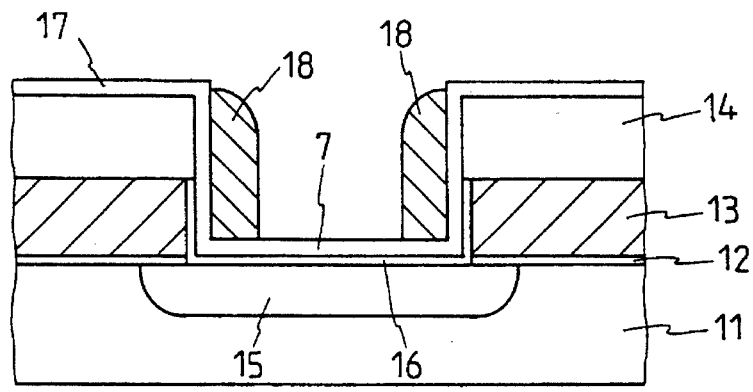

Referring to FIG. 1B, impurities are deposited on the exposed semiconductor substrate 11 to form source/drain electrode 15, the first conductive line; a thin oxide layer 16 of 300 to 500 Å is formed at the side wall of the gate electrode 13 and on the upper part of source/drain electrode 15. During the next process of thermal oxidation, to prevent the diffusion of oxygen, a nitride layer 17 of 100 to 500 Å, barrier material, formed by chemical vapor deposition (hereinafter referred to as "CVD") method is applied on the whole surface. Thereafter silicon spacer 18 of 500 to 2000 Å in thickness is formed by the common spacer-forming methods at the side wall of the gate electrode 13 and upper surface of the interlayer oxide 14.

The thin oxide layer 16, formed at the side wall of the gate electrode 13 can be formed by thermal oxidation or CVD techniques, and this layer may be formed before source/drain electrode 15. The silicon spacer 18 is formed by anisotropic etching, after poly or amorphous-silicon layer (unillustrated in the drawing) of certain thickness is applied on said nitride layer 17.

Figure 1C:
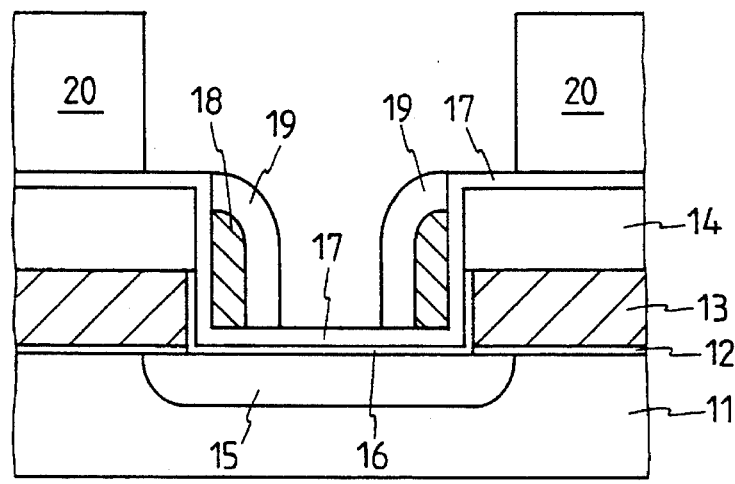

Referring to FIG. 1C, the silicon spacer 18 that was formed at the side wall of the contact hole 10, the gate electrode 13 and the interlayer oxide 14, is thermally oxidized to form a thermal oxide layer 19 of desired thickness; hence, to prevent the influx of oxygen when thermal oxide 19 is grown, the nitride layer 17 is formed at the surface of the gate electrode 13 and at source/drain electrode 15. Thus, the oxide compound does not grow thicker. The thermal oxide 19 at the surface of the silicon spacer 18 thickness is thickly formed compared to the combined thickness of both thin oxide layer 16 and nitride layer 17 on the upper part of source/drain electrode 15. This takes account of the pattern tolerance during the next etching process. Then, the photoresist pattern 20, contact mask, is formed so that some parts of contact hole 10 in the thermal oxide layer 16 and nitride layer 17 are exposed. Hence, the photoresist pattern 20 may be formed in order for some parts of nitride layer 17 not to be exposed.

Figure 1D:
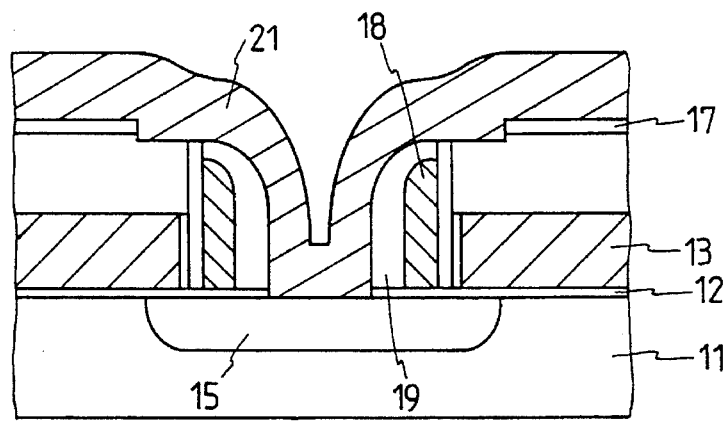

Referring to FIG. 1D, the photoresist pattern 20 is used as a mask, and the thin oxide layer 16 and nitride layer 17 on the upper part of source/drain electrode 15 are etched in due sequence to expose the source/drain electrode 15. Hence, by modulating the etching thickness properly, the interlayer oxide 14 on the upper part of gate electrode 13 and the thermal oxide layer 19 formed on the surface of the silicon spacer 18 should be sufficiently preserved. Thereafter, the contact hole 10 is filled up by the metal wiring 21, the third conductive line, which connects to the source/drain electrode 15, thus completing the contact thereof.

Here, we describe the method of insulating the metal wiring from the gate electrode while connecting the metal wiring to the source/drain electrode, but this can be totally applicable to the contact that in general, the third conductive line is connected to the first conductive line through the second conductive line, while insulating the second conductive line.

Figure 2A:
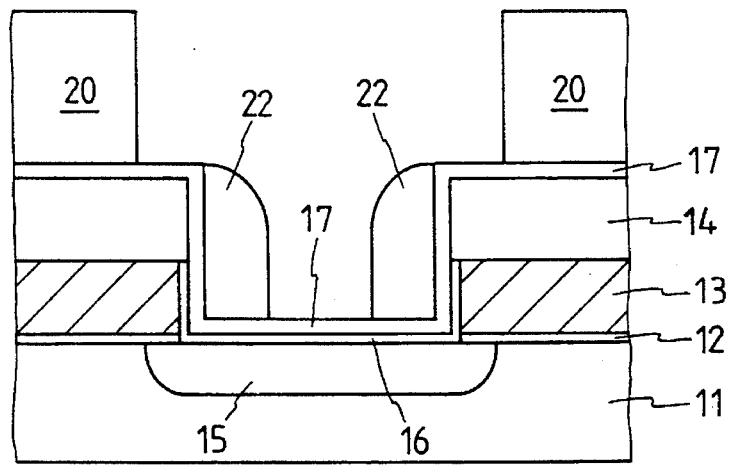
FIG. 2A–2B are cross sectional views illustrating the processes for making self-aligned contact of the semiconductor device in the second embodiment of the invention.
Figure 2B:
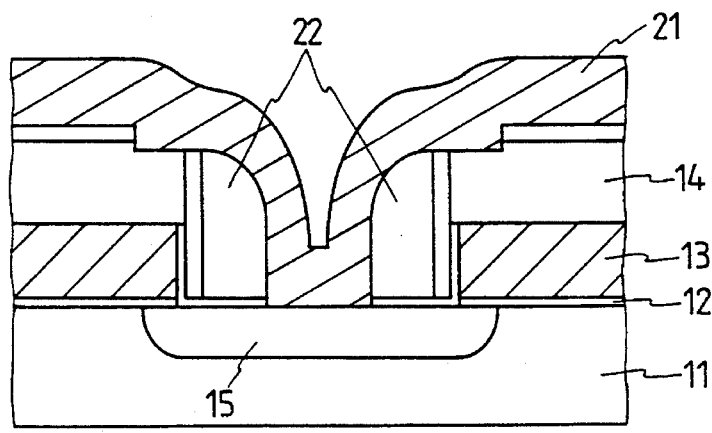

FIG. 2A and FIG. 2B are processes for making a self-aligned contact in a semiconductor device according to the second application of this invention and are proceeded to as the next processes after status shown in FIG. 1B.

Referring to FIG. 2A, as illustrated in FIG. 1B, it consists of said gate dielectric layer 12, gate electrode 13, interlayer oxide 14, source/drain electrode 15, thin oxide layer 16, nitride layer 17 and silicon spacer 18, as already described in the previous process. The silicon spacer 18 is completely thermally oxidized to form the thermal oxide layer 22, and on the surface of nitride layer 17 in the interlayer oxide 14, the photoresist pattern 20 is formed to expose some parts of the contact hole of the nitride layer 17. Hence, the photoresist pattern 20 may be formed by a method whereby without exposing some parts of nitride layer 17, only the inside of contact hole is exposed. Then, it makes the thickness of the above-said oxide layer 22 sufficiently thicker than the combined thickness of both thin oxide layer 16 and nitride layer 17 on the upper side of the source/drain electrode 15 in consideration of the next etching processes.

Referring to FIG. 2B, a thin oxide layer 16 and nitride layer 19 on the upper part of source/drain electrode 15, being exposed by the photoresist pattern 20, are etched to expose the source/drain electrode 15. Hence, by modulating the etching thickness properly, the interlayer oxide 18 on the upper part of gate electrode 13 and the thermal oxide layer 22 formed at the side wall of gate electrode 13 remain sufficiently 9 preserved. Thereafter, the metal wiring 21, the third conductive line, which connects to the source/drain electrode 15, is formed.

As described above, the method of making self-aligned contact in a semiconductor device according to this invention has advantages of reducing the contact area due to the increase of contact mask tolerance for making the contact hole by forming a silicon spacer, which is insulated from the second conductive line, on the lateral sides of the contact hole which is for connecting vertically the first conductive line and the third conductive line; thermally oxidizing the part or the whole of the above-said silicon spacer; and insulating the upper part of the above-said silicon spacer.

What is claimed is:

1. A method of making a self-aligned contact in a semiconductor device comprising the steps of:

a) forming sequentially a first dielectric layer, a second conductive line, and a second dielectric layer on a semiconductor substrate;

b) forming a contact hole by successively removing the second dielectric layer, the second conductive line and the first dielectric layer from above a region of the semiconductor substrate, thereby exposing the semiconductor substrate, said contact hole thereby having an inner wall surface that includes a sidewall of the second conductive line and a sidewall of the second dielectric layer;

c) forming a first conductive line by depositing impurities into the exposed semiconductor substrate;

d) forming an oxide layer at the side wail of the second conductive line within said contact hole and on the first conductive line;

e) forming a nitride layer on the surface of the oxide layer and the second dielectric layer, the nitride layer thereby having a nitride wall portion within said contact hole, said nitride wall portion On the oxide layer at the sidewall of the second conductive line and on the sidewall of the second dielectric layer;

f) forming a silicon spacer on the nitride wall portion;

g) forming a thermal oxide by thermally oxidizing said silicon spacer to a desired thickness;

h) exposing the first conductive line by removing said nitride layer, oxide layer, and a portion of the thermal oxide layer which are exposed to the inside of the contact hole, and also by removing said nitride layer and the second dielectric layer outside of the contact hole an appropriate thickness, while leaving a substantial thickness of the second dielectric layer and of the thermal oxide formed on the surface of the silicon spacer; and i) forming a third conductive line contacted with the exposed first conductive line.

2. A method of claim 1, wherein said step for forming the thermal oxide layer is carried out by entirely thermal oxidizing the silicon spacer.

3. A method of claim 1, wherein the thickness of the oxide layer is 50 to 300 Å, on the first conductive line and the second conductive line.

4. A method of claim 1, wherein the thickness of nitride layer is 100 to 500 Å.

5. A method of claim 1, wherein said silicon spacer is formed by anisotropic etching, after poly or amorphous silicon layer is formed on the nitride.

6. A method of claim 1, wherein said silicon spacer has a thickness in the range of 500 to 2000 Å.

* * * * *